United States Patent
Fujiwara et al.

(10) Patent No.: US 7,242,026 B2
(45) Date of Patent: Jul. 10, 2007

(54) SEMICONDUCTOR LIGHT-EMITTING DEVICE

(75) Inventors: Hiroyuki Fujiwara, Hachioji (JP); Mitsuhiko Ogihara, Hachioji (JP)

(73) Assignee: Oki Data Corporation, Tokyo (JP)

( * ) Notice: Subject to any disclaimer, the term of this patent is extended or adjusted under 35 U.S.C. 154(b) by 0 days.

(21) Appl. No.: 10/900,281

(22) Filed: Jul. 28, 2004

(65) Prior Publication Data
US 2005/0023539 A1    Feb. 3, 2005

(30) Foreign Application Priority Data
Jul. 31, 2003   (JP) .............................. 2003-283466

(51) Int. Cl.
*H01L 27/15* (2006.01)
*H01L 29/22* (2006.01)

(52) U.S. Cl. .................. 257/79; 257/94; 257/98; 257/E33.013; 372/43; 372/72

(58) Field of Classification Search ........... 257/79, 257/94, 98, E33.013; 372/43, 72
See application file for complete search history.

(56) References Cited

U.S. PATENT DOCUMENTS

| | | | | |
|---|---|---|---|---|
| 6,097,041 A | * | 8/2000 | Lin et al. ................ | 257/98 |
| 6,188,083 B1 | * | 2/2001 | Kano ...................... | 257/17 |
| 2003/0215266 A1 | * | 11/2003 | Ishida et al. ........... | 399/223 |

FOREIGN PATENT DOCUMENTS

JP   2002-217450   8/2002

* cited by examiner

*Primary Examiner*—Jerome Jackson
*Assistant Examiner*—Joseph Nguyen
(74) *Attorney, Agent, or Firm*—Rabin & Berdo, P.C.

(57) ABSTRACT

A semiconductor light-emitting device includes a semiconductor light-emitting thin film, the thickness h of which satisfies the following conditional equation:

$$0.9 \times (2m+1)\frac{\lambda_0}{4n} \leq h \leq 1.1 \times (2m+1)\frac{\lambda_0}{4n}$$

and m in the conditional equation satisfies the following conditional equation:

$$\frac{2m+1}{m(m+1)} \frac{\lambda_0}{2} > \xi$$

where $\lambda_0$ is a center wavelength of light generated in the semiconductor light-emitting thin film, n is a refractive index of the semiconductor light-emitting thin film, m is 0 or a positive integer, and $\xi$ is a half bandwidth of a light emission spectrum when there is no interference between light rays generated in the semiconductor light-emitting thin film.

17 Claims, 6 Drawing Sheets

SEMICONDUCTOR LIGHT-EMITTING DEVICE

BACKGROUND OF THE INVENTION

1. Field of the Invention

The present invention relates to a surface light-emitting type semiconductor light-emitting device such a double hetero LED or a laser, to an LED head including the semiconductor light-emitting device, to an image-forming apparatus including the semiconductor light-emitting device, and to a method of manufacturing the semiconductor light-emitting device.

2. Description of the Related Art

A semiconductor light-emitting device wherein a light-reflecting film, semiconductor light-emitting layer and anode electrode are laminated successively on an electrically conducting plate (cathode electrode) has been proposed in, for example, Japanese Patent Application Laid-Open Publication No. 2002-217450 (pp. 5-7, FIG. 1), which is referred to "Patent Reference 1." This semiconductor light-emitting device has a surface light-emitting construction wherein light which has been generated in an active layer of the semiconductor light-emitting device and radiated through all azimuths, is directly or after reflection via a light-reflecting film, extracted via the main surface on the anode electrode side of the semiconductor light-emitting layer.

However, if an optically reflecting surface (in Patent Reference 1, the light-reflecting film and the anode electrode) is formed on both surfaces of the semiconductor light-emitting layer, interference may occur due to the superimposition of the light rays generated in the active layer which pass through the main surface of the semiconductor light-emitting layer, and the light rays generated in the active layer which pass through the main surface of the semiconductor light-emitting layer after being reflected by the optically reflecting surfaces on both sides of the semiconductor light-emitting layer. As a result, the light extracted from the main surface of the semiconductor light-emitting layer has a different spectral distribution (i.e., a spectral distribution wherein a specific wavelength is stronger and another specific wavelength is weaker) from natural light emission. Under the conditions where such interference occurs, the spectral distribution largely varies due to scatter in the film thickness of the semiconductor light-emitting layer or the reflectivity of the optically reflecting surfaces, and therefore there is a large scatter in the light-emitting properties of the semiconductor light-emitting device due to manufacturing error.

SUMMARY OF THE INVENTION

It is therefore an object of the present invention to reduce the scatter in light-emitting properties of a semiconductor light-emitting device by setting the thickness of the semiconductor light-emitting device to a value at which interference between emitted light rays does not easily occur.

According to the present invention, a semiconductor light-emitting device includes a semiconductor light-emitting thin film having a first surface and a second surface arranged facing in opposite directions; a first optically reflecting surface disposed on the first surface of the semiconductor light-emitting thin film; and a second optically reflecting surface disposed on the second surface of the semiconductor light-emitting thin film, wherein light generated in the semiconductor light-emitting thin film passes through the first surface and is then emitted. When $\lambda_0$ is a center wavelength of light generated in the semiconductor light-emitting thin film, n is a refractive index of the semiconductor light-emitting thin film, h is a thickness of the semiconductor light-emitting thin film, m is 0 or a positive integer, and $\xi$ is a half bandwidth of a light emission spectrum when there is no interference between light rays generated in the semiconductor light-emitting thin film, the thickness h satisfies a following conditional equation:

$$0.9 \times (2m+1)\frac{\lambda_0}{4n} \leq h \leq 1.1 \times (2m+1)\frac{\lambda_0}{4n}$$

and, when m is not 0, m in the conditional equation (1) satisfies a following conditional equation:

$$\frac{2m+1}{m(m+1)} \frac{\lambda_0}{2} > \xi.$$

In addition, it is desirable that the semiconductor light-emitting device of the present invention satisfy a following conditional equation of the thickness h:

$$h = (2m+1)\frac{\lambda_0}{4n}.$$

According to the present invention, the thickness of a semiconductor light-emitting thin film is set to a value at which interference between light rays extracted from a first surface of the semiconductor light-emitting thin film does not occur, i.e., the thickness of the semiconductor light-emitting thin film is set to a value at which the variations in light-emitting properties due to scatter in the thickness of the semiconductor light-emitting thin film are small, so the scatter in light-emitting properties between different semiconductor light-emitting devices or between plural light-emitting parts in the same semiconductor light-emitting device, can be reduced.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE INVENTION

Further scope of applicability of the present invention will become apparent from the detailed description given hereinafter. However, it should be understood that the detailed description and specific examples, while indicating preferred embodiments of the invention, are given by way of illustration only, since various changes and modifications will become apparent to those skilled in the art from the detailed description.

FIRST EMBODIMENT

Figure 1:
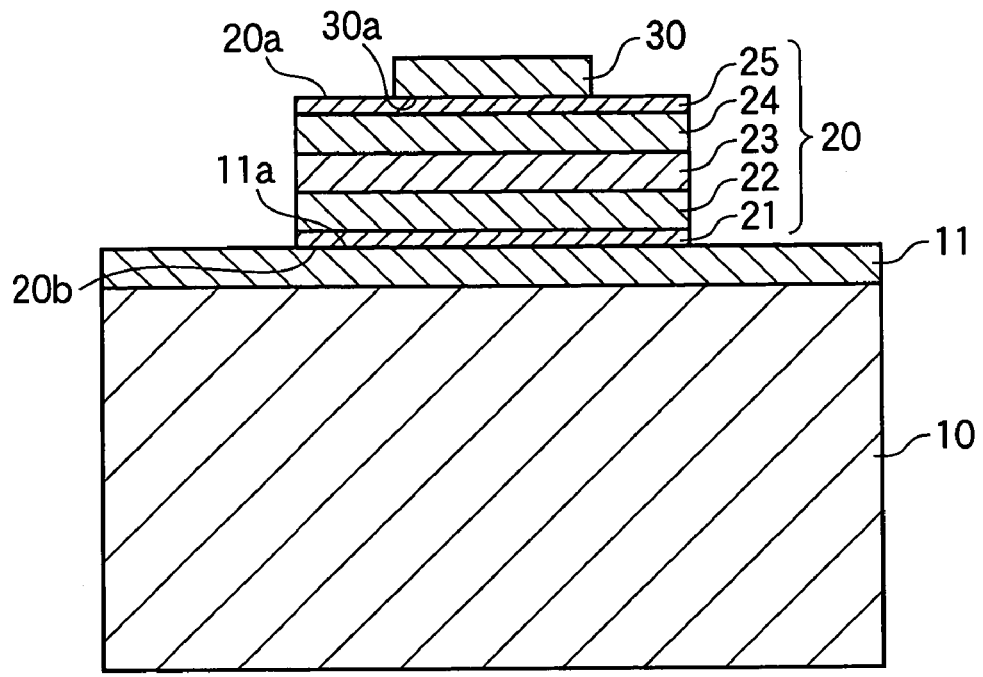
FIG. 1 is a cross-sectional view schematically showing the construction of a semiconductor light-emitting device according to a first embodiment of the present invention.

FIG. 1 is a cross-sectional view schematically showing the construction of a semiconductor light-emitting device according to a first embodiment of the present invention. As shown in FIG. 1, the semiconductor light-emitting device according to the first embodiment includes a support 10, a metal layer 11 provided on the support 10, an LED epitaxial film (also referred to as "LED epi-film") 20 which is a semiconductor light-emitting thin film disposed on the metal layer 11, and an electrode 30 disposed on the LED epitaxial film 20.

The support 10 may, for example, include a dielectric such as glass, a semiconductor such as Si (silicon), or a conductor such as Al (aluminum). The thickness of the support 10 may be given a value, for example, within a range of 10 μm-18 μm. The metal layer 11 may be formed from an electrically conducting metal such as Al or the like. However, the metal layer 11 can also be formed from another electrically conducting material which can be ohmically connected to the LED epitaxial film 20. Also, a surface 11a (the upper surface in FIG. 1) of the metal layer 11 is an optically reflecting surface.

The LED epitaxial film 20 is disposed so that its second surface 20b (the lower surface in FIG. 1) is superimposed on the surface 11a of the metal layer 11. The LED epitaxial film 20 may have a construction wherein, for example, an n-GaAs contact layer 21, an n-$Al_xGa_{1-x}As$ cladding layer 22, an $Al_yGa_{1-y}As$ active layer 23, a p-$Al_zGa_{1-z}As$ cladding layer 24, and a p-GaAs contact layer 25 are laminated together. Herein, the compositional ratio of Al may, for example, be x=z=0.4 and y=0.15. The center wavelength of the light emission spectrum at this time is approximately 760 nm.

The electrode 30 is disposed such that its lower surface 30a is superimposed on the first surface 20a (the upper surface in FIG. 1) of the LED epitaxial film 20. For example, when the electrode 30 is a metal electrode, the lower surface 30a of the electrode 30 is an optically reflecting surface. The electrode 30 may, for example, be a laminated film of Ti/Pt/Au. However, the electrode 30 may also be formed from another electrically conducting material which can be ohmically connected to the LED epitaxial film 20.

In the semiconductor light-emitting device according to the first embodiment, light generated in the active layer 23 of the LED epitaxial film 20, is directly, or after one or more reflections by the surface (optically reflecting surface) 11a of the metal layer 11 and the lower surface (optically reflecting surface) 30a of the electrode 30, emitted via a first surface (light-extracting surface) 20a of the LED epitaxial film 20.

Also, in the semiconductor light-emitting device according to the first embodiment, the thickness h of the LED epitaxial film 20 is set to a value such that the LED epitaxial film 20 does not interfere with the light extracted from the first surface 20a of the LED of the epitaxial film 20. Specifically, the LED epitaxial film 20 is formed so that the thickness h of the LED epitaxial film 20 satisfies the conditional equation (1):

$$0.9 \times (2m+1)\frac{\lambda_0}{4n} \leq h \leq 1.1 \times (2m+1)\frac{\lambda_0}{4n} \quad (1)$$

wherein, when m is not 0, in the conditional equation (1) satisfies the conditional equation (2):

$$\frac{2m+1}{m(m+1)}\frac{\lambda_0}{2} > \xi \quad (2)$$

In the conditional equations (1) and (2), $\lambda_0$ is the light emission center wavelength of the light generated by the LED epitaxial film 20, n is the refractive index of the LED epitaxial film 20, h is the thickness of the LED epitaxial film 20 (i.e., the distance between the first surface 20a and second surface 20b), m is 0 or a positive integer, and $\xi$ is the half bandwidth of the light emission spectrum when there is no interference between the light rays generated by the LED epitaxial film 20. Also, the numbers "0.9" and "1.1" in the conditional equation (1) are degrees of tolerance taking account of the manufacturing error (normally, within ±10%) of the LED epitaxial film 20.

More preferably, the semiconductor light-emitting device according to the first embodiment has a construction such that the thickness h of the LED epitaxial film 20 substantially satisfies the conditional equation (3):

$$h = (2m+1)\frac{\lambda_0}{4n} \quad (3)$$

Specifically, the value of the thickness h is preferably within about ±10 nm of the value calculated on the right-hand side of the conditional equation (3), i.e., $(2m+1)\lambda_0/4n$.

In the light-emitting device according to the first embodiment, for example, n=3.4, $\lambda_0$=760 nm and $\xi$ is of the order of 40 nm. From the conditional equation (2), the following equation (4) holds:

$$m < \frac{-(\xi-\lambda_0) + \sqrt{(\xi-\lambda_0)^2 - 2\xi(-\lambda_0)}}{2\xi} \quad (4)$$

so m is a positive integer satisfying:

$$0 < m < 9 + \sqrt{\frac{181}{2}}$$ (5)

or zero. Specifically, m can be any of the values 0, 1, 2, ..., 18. Therefore, the thickness h may be set to a value satisfying the conditional equation (1). Further, the preferred thickness h calculated from the conditional equation (3) is 55.9 nm for m=0, 167.6 nm for m=1, and 279.4 nm for m=3. It can be calculated in an identical way for m=3 to 17, and it is 2067.6 nm for m=18.

As described above, in the semiconductor light-emitting device according to the first embodiment, the thickness h of the LED epitaxial film 20 is set to a value at which interference between the light rays extracted from the first surface 20a of the LED epitaxial film 20 does not occur. Specifically, in the semiconductor light-emitting device according to the first embodiment, the thickness h of the LED epitaxial film 20 is set to a value at which variations in light-emission properties due to scatter in the thickness h of the LED epitaxial film 20 are small. As a result, in the semiconductor light-emitting device according to the first embodiment, scatter in light emission properties between different semiconductor light-emitting devices can be reduced.

Figure 2:
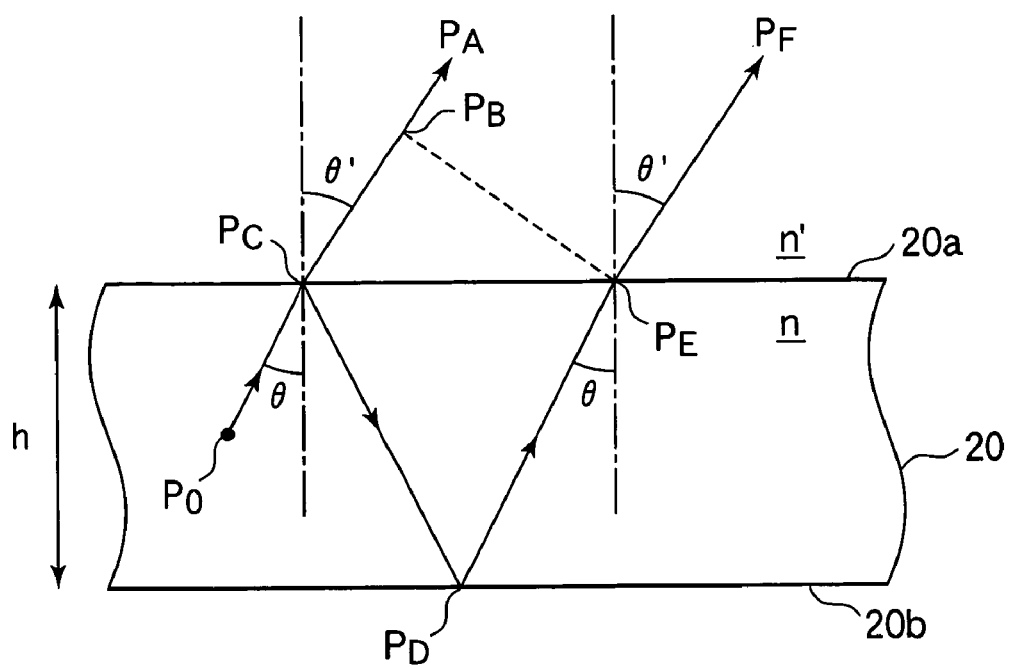
FIG. 2 is a diagram describing conditional equations relating to the thickness of an LED epitaxial film of the semiconductor light-emitting device according to the first embodiment.

Next, the method of deriving the aforesaid conditional equations (1)-(3) will be described. FIG. 2 is a drawing describing the process of deducing the conditional equations (3) and (2). In FIG. 2, h is the thickness of the LED epitaxial film 20, $P_O$ is the position of a light-emitting part (light source) in the LED epitaxial film 20, $\theta$ is the incidence angle of a light ray $P_O P_C$ generated in the light-emitting part $P_O$ and incident on the light extracting surface 20a of the LED epitaxial film 20, $\theta'$ is the emergence angle (refraction angle) of a light ray $P_C P_A$ incident at the incidence angle $\theta$ on the light extracting surface 20a of the LED epitaxial film 20, n is the refractive index of the LED epitaxial film 20, and n' is the refractive index of air. At this time, light leaving the light-emitting part $P_O$ either proceeds along the path $P_O P_C P_A$, or is reflected by the optically reflecting surfaces to proceed along the path $P_O P_C P_D P_E P_F$. As a result, a phase difference occurs between the light ray $P_C P_A$ and the light ray $P_E P_F$, and interference may occur. Writing the wave number $2\pi/\lambda$ as k, n sin $\theta$=n sin $\theta'$, so a phase difference $\delta$ is given by the following equation (5):

$$\delta = -k\{n(\overline{P_C P_D} + \overline{P_D P_E}) - n'\overline{P_B P_C}\}$$ (5)

$$= -\frac{2\pi}{\lambda}\left(n\frac{2h}{\cos\theta} - 2n'h\tan\theta\sin\theta'\right)$$

$$= -\frac{4\pi nh}{\lambda}\cos\theta$$

Next, taking the amplitude of the light at the light-emitting part $P_O$ as "a", the transmittivity of the light from the LED epitaxial film 20 to air as "t", the reflectivity at the first surface (upper surface) 20a of the LED epitaxial film 20 as $r_1$, the reflectivity at the second surface (lower surface) 20b of the LED epitaxial film 20 as $r_2$, the amplitude of the light at the point $P_A$ in air is "at", and the amplitude of the light at the point $P_F$ in air is "$ar_1 r_2 t$". As light is a wave, writing the state where the wave at the point $P_A$ and the wave at the point $P_F$ are combined as X, the interference light equation is given by the following equation (6):

$$X = at \cdot e^{i(kx+\omega t)} - a r_1 r_2 t \cdot e^{i(kx+\omega t+\delta)}$$ (6)

$$= at\left(1 - r_1 r_2 \cdot e^{-i\frac{4\pi nh}{\lambda}\cos\theta}\right) e^{i(kx+\omega t)}$$

$$\equiv \alpha(1 - \beta e^{-i\gamma}) e^{i(kx+\omega t)}$$

$$= (\alpha - \alpha\beta\cos\gamma + i\alpha\beta\sin\gamma) e^{i(kx+\omega t)}$$

The amplitude at this time is $\alpha-\alpha\beta \cos \gamma+i\alpha\beta \sin \gamma$. Herein, $\alpha$=at, $\beta=r_1 r_2$, and $\gamma=(4\pi nh/\lambda)\cos \theta$. Therefore, the amplitude "A" of the interference light is given by the following equation (7):

$$|A|^2 = \alpha^2(1+\beta^2-2\beta\cos\gamma)$$ (7)

Assuming that the distribution of light from the light-emitting part $P_O$ at the point $P_A$ is Lorentzian, when the incidence angle on the light extracting surface is 0°, equation (7) can be modified to give equation (8):

$$|A|^2 = C_0\left\{\frac{1}{1+\tau^2(\lambda-\lambda_0)^2}\right\}^2\left(1+\beta^2-2\beta\cos\frac{4\pi nh}{\lambda}\right)$$ (8)

Herein, writing equation (9):

$$f(\lambda) = 1 + \beta^2 - 2\beta\cos\frac{4\pi nh}{\lambda}$$ (9)

equation (8) is obtained by multiplying the square of the Lorentzian:

$$\left\{\frac{1}{1+\tau^2(\lambda-\lambda_0)^2}\right\}$$

by $f(\lambda_0)$.

To maximize the light extracting efficiency at the wavelength $\lambda_0$, $f(\lambda_0)$ must be maximized. $f(\lambda_0)$ is maximized when:

$$\cos(4\pi nh)/\lambda_0 = -1$$ (10)

From equation (10),
4 $\pi nh/\lambda_0=(2m+1)\pi$, so
h=$(2m+1)\lambda_0/4n$, i.e., the above conditional equation (3) is obtained. Herein, m=0, 1, 2, . . . . Therefore, equation (9) becomes the following equation (11):

$$f(\lambda) = 1 + \beta^2 - 2\beta\cos\left\{(2m+1)\pi\frac{\lambda_0}{\lambda}\right\}$$ (11)

Figure 3:
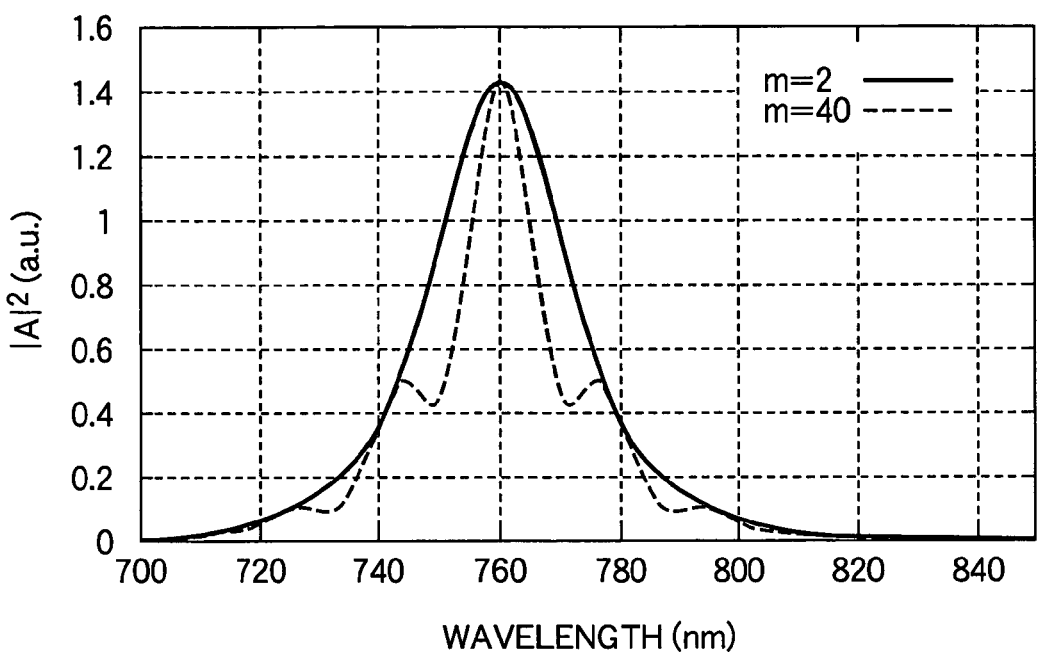
FIG. 3 is a diagram showing a light emission spectrum of the semiconductor light-emitting device according to the first embodiment.

FIG. 3 is a diagram showing the light emission spectrum when m is 2 and 40 in the semiconductor light-emitting device according to the first embodiment. FIG. 3 shows the square of the absolute value of the amplitude "A" of the interference light, i.e., $|A|^2$, where $\beta$=0.2, $\lambda_0$=760 nm, $\tau$=0.05, and Co=1. As shown in FIG. 3, the value of $|A|^2$ at a wavelength of $\lambda=\lambda_0$ is the same even if m varies. Also, as shown by the broken line in FIG. 3 (when m is 40), when m increases to some extent, small peaks (in FIG. 3, for example, this is in the vicinity of 745 nm and 775 nm) appear in the spectrum. This is because as m increases, h increases, and f($\lambda$) rapidly changes the larger the value of h is. Therefore, h decreases the smaller m is, and the change of f($\lambda$) becomes smaller, the smaller the value of h is. This means that the smaller m is, the less the spectral distribution of light rays extracted from the semiconductor light-emitting device is affected by scatter in the thickness h of the LED epitaxial film 20. This is convenient for manufacturing a large number of devices in one operation, as devices having little scatter in their light emission spectrum and uniform properties can be mass-produced.

Figure 4:
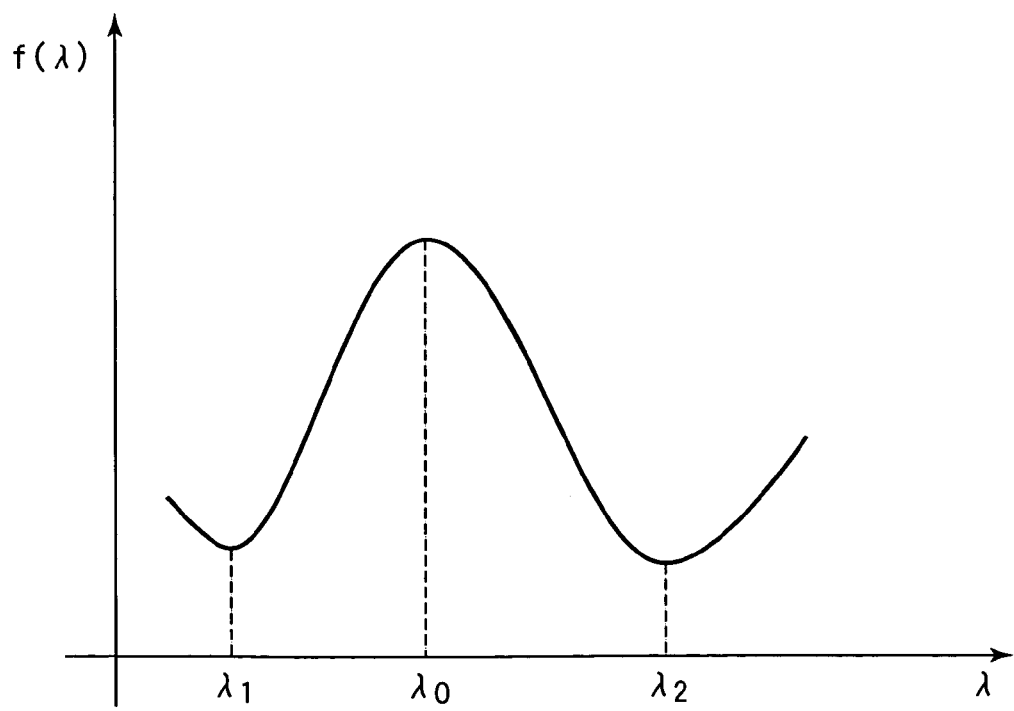
FIG. 4 is a diagram showing a function relating to the light emission spectrum of the semiconductor light-emitting device according to the first embodiment.

The maximum value of h at this time can be found as follows. As shown in FIG. 4, if m is determined so that f($\lambda$) is a maximum at $\lambda=\lambda_0$, the wavelength at which f($\lambda$) is a minimum at the nearest value to $\lambda_0$ which is less than $\lambda_0$ is taken as $\lambda_1$, and the wavelength at which f($\lambda$) is a minimum at the nearest value to $\lambda_0$ which is more than $\lambda_0$ is taken as $\lambda_2$. Herein, the value of m is limited so that:

$$\lambda_2 - \lambda_1 > \epsilon \quad (12)$$

Specifically, f($\lambda$) is only given a period less than one period within the spectral half bandwidth $\xi$. The upper limiting value of h is determined from the value of m thus determined.

The above conditions show that when m≠0, the cos (cosine) in the function f($\lambda$) in equation (11) varies between $\lambda_1$-$\lambda_2$ or $\lambda_2$-$\lambda_0$. Therefore, the following relations (13) and (14) hold:

$$(2m+1)\pi\frac{\lambda_0}{\lambda_1} - (2m+1)\pi\frac{\lambda_0}{\lambda_0} = \pi \quad (13)$$

$$(2m+1)\pi\frac{\lambda_0}{\lambda_0} - (2m+1)\pi\frac{\lambda_0}{\lambda_2} = \pi \quad (14)$$

From equations (13) and (14), the following equation (15) is obtained:

$$\lambda_2 - \lambda_1 = \frac{2m+1}{m(m+1)}\frac{\lambda_0}{2} \quad (15)$$

From equation (12) and equation (15), the above conditional equation (2) is obtained. When m=0, from equation (11), the following equation (16):

$$f(\lambda) = 1 + \beta^2 - 2\beta \cos\frac{\lambda_0 \pi}{\lambda} \quad (16)$$

is obtained, $\lambda_2=\infty$, and equation (11) is satisfied.

Figure 5A:
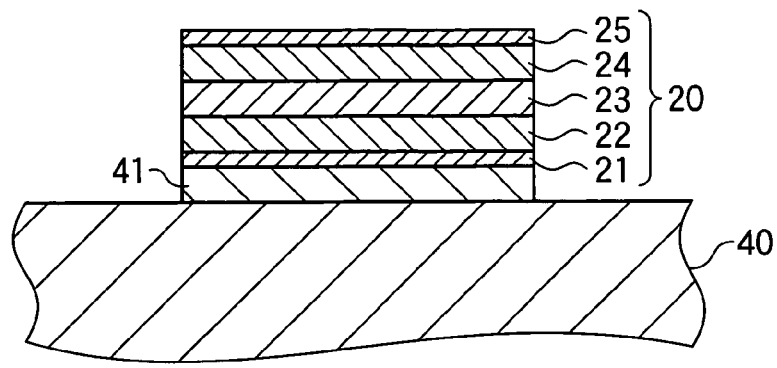
FIGS. 5A to 5C are cross-sectional views schematically showing a method of manufacturing the semiconductor light-emitting device according to the first embodiment.
Figure 5B:
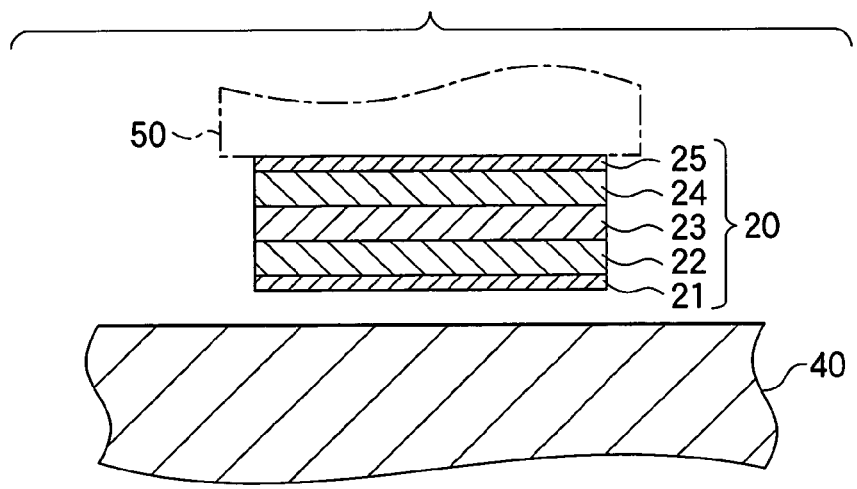
Figure 5C:
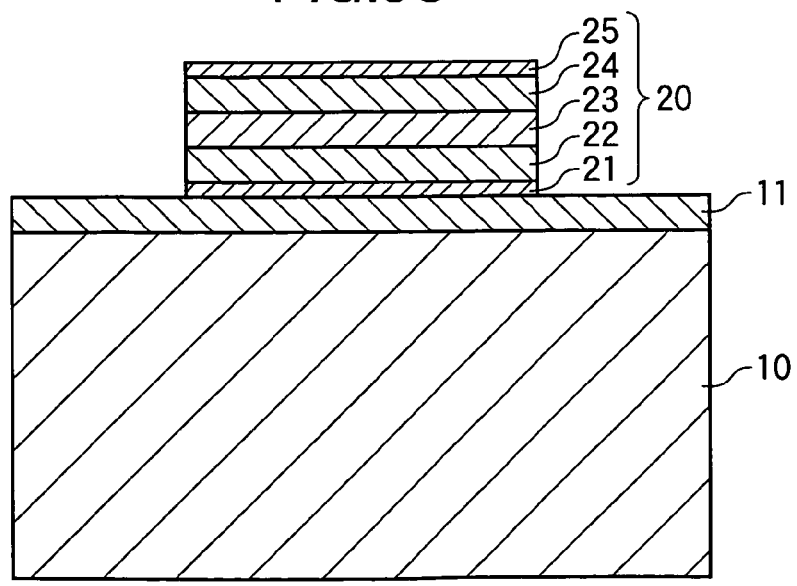

FIGS. 5A to 5C are cross-sectional views schematically showing the method of manufacturing the semiconductor light-emitting device according to the first embodiment. FIGS. 5A to 5C show the epitaxial liftoff (ELO) method. When the semiconductor light-emitting device according to the first embodiment is manufactured, firstly, as shown in FIG. 5A, a sacrificial layer 41 including AlAs or the like on a GaAs substrate 40 is epitaxially grown, and then the epitaxial layers 21 to 25 forming the LED epitaxial film 20 are epitaxially grown in succession. Next, as shown in FIG. 5B, while holding the LED epitaxial film 20 by a holding member 50, the sacrificial layer 41 is selectively etched alone by, for example, 10% HF solution, and the LED epitaxial film 20 is thereby separated from the GaAs substrate 40. Next, as shown in FIG. 5C, the LED epitaxial film 20 is stuck to the metal layer 11 formed on an LED epitaxial film sticking area of the substrate 10. The sticking may, for example, be performed by filling a small amount of pure water between the LED epitaxial film 20 and the metal layer 11, and drying the pure water while pressing the LED epitaxial film 20 against the metal layer 11. Subsequently, in order to strengthen the bond, sintering may also be performed at a temperature of about 200° C.

Subsequently, the stuck LED epitaxial film 20 is etched to a desired shape if required by wet etching or the like. The etchant used for this purpose may, for example, be phosphoric acid perhydrate. Next, the electrode 30 is formed as shown in FIG. 1 using, for example, the liftoff method.

As described above, when the epitaxial liftoff method is used, the GaAs substrate used in the process for forming the LED epitaxial film 20 can be reused, so costs can be reduced. It may be noted that, instead of the epitaxial liftoff method, the GaAs substrate (substrate corresponding to the GaAs substrate 40 in FIG. 5) can be removed also by polishing (e.g., as disclosed on page 8 of Patent Reference 1).

Also, in the aforesaid description, the case was described where the LED epitaxial film 20 was formed from a GaAs layer and an AlGaAs layer, but the LED epitaxial film 20 can also be formed from GaP. The emission light center wavelength $\lambda_0$ in this case is 700 nm, the refractive index n is 3.299 and the half bandwidth $\xi$ is 100 nm. In this case, from the aforesaid equation (4), m is given by 0<m<3+√10, or 0. Therefore, m can be given any of the values 0, 1, 2, . . . , 6. Therefore, the thickness h can be made a value satisfying the aforesaid conditional equation (1). Also, the desired thickness h calculated from the aforesaid conditional equation (3) is 53.0 nm when m is 0, 159.1 nm when m is 1, and 265.2 nm when m is 2. It can be calculated in the same way when m is 3 to 5, and is 689.6 nm when m is 6.

SECOND EMBODIMENT

Figure 6:
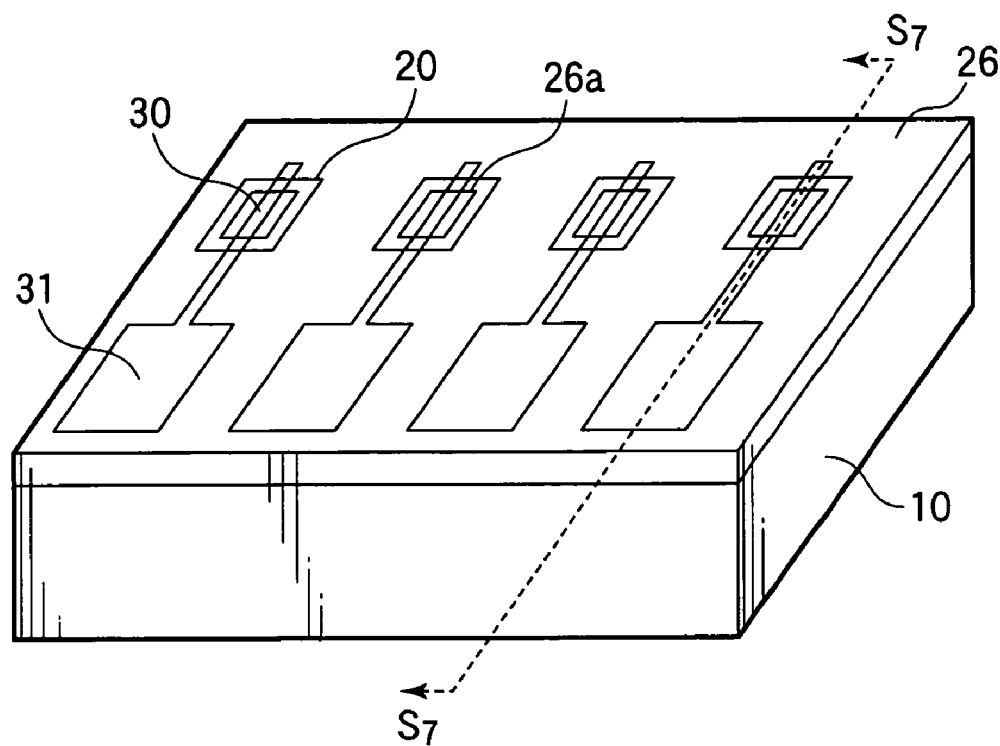
FIG. 6 is a perspective view schematically showing the construction of the semiconductor light-emitting device according to a second embodiment of the present invention.
Figure 7:
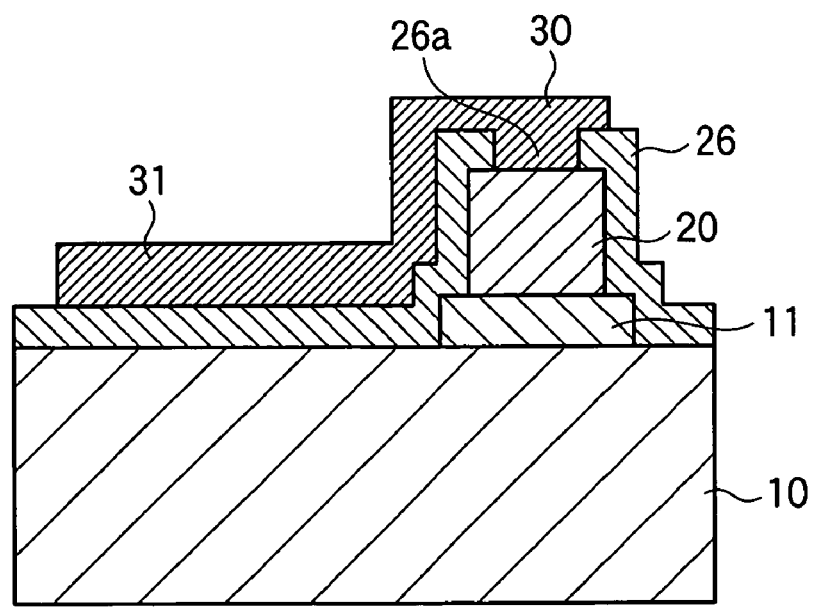
FIG. 7 is a cross-sectional view schematically showing a section through a line $S_7$-$S_7$ in FIG. 6.

FIG. 6 is a perspective view schematically showing the construction of a semiconductor light-emitting device according to a second embodiment of the present invention. FIG. 7 is a cross-sectional view schematically showing a section through a line $S_7$-$S_7$ in FIG. 6. In FIG. 6 and FIG. 7, identical symbols are assigned to identical or corresponding parts of the construction of FIG. 1.

As shown in FIG. 6 and FIG. 7, the semiconductor light-emitting device according to the second embodiment includes a support 10, a metal layer 11 provided on the support 10, plural LED epitaxial films 20 (in FIG. 6, four are shown but the invention is not limited to four) arranged in one row on the metal layer 11, an insulating film 26 disposed on the LED epitaxial film 20, and an electrode 30 connected on the LED epitaxial film 20 via a contact hole 26a formed in the insulating film 26. The electrode 30 is connected to an electrode pad 31 disposed on the insulating film 26. The semiconductor light-emitting device according to the second embodiment has an identical construction to the semiconductor light-emitting device of the first embodiment, and satisfies the aforesaid conditional equations (1) and (2), or the conditional equations (3) and (2). The light emitted by the LED epitaxial film 20 can be extracted via the contact hole 26a.

When the insulating film 26 is a film of SiN or SiO$_2$ or the like, the thickness may be arranged to be 1000 Angstrom. The contact hole 26a in the insulating film 26 can be formed using a photolithography technique. Also, the electrode pad 31 of the electrode 30 is preferably formed by a common manufacturing process.

As described above, in the semiconductor light emitting device according to the second embodiment, as in the case of the first embodiment, the scatter in light emission properties between different semiconductor light-emitting devices can be reduced. Also, in the semiconductor light-emitting device according to the second embodiment, the scatter in light emission properties between different light-emitting parts in the semiconductor light-emitting device, can be reduced.

THIRD EMBODIMENT

Figure 8:
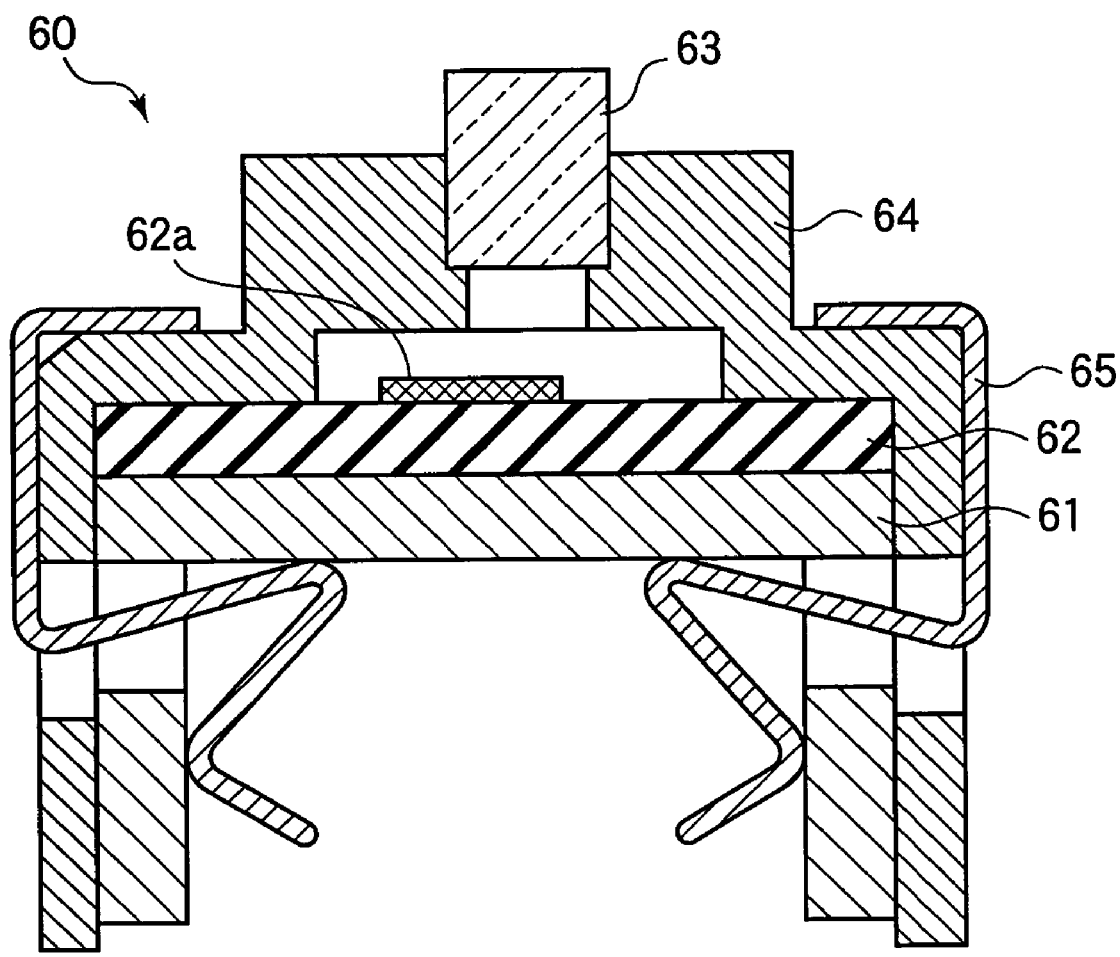
FIG. 8 is a cross-sectional view schematically showing the construction of an LED head according to a third embodiment of the present invention.

FIG. 8 is a cross-sectional view schematically showing the construction of an LED head according to a third embodiment of the present invention. As shown in FIG. 8, an LED head 60 includes a base member 61, an LED unit 62 fixed on the base member 61, a rod lens array 63 including pillar-shaped optical elements arranged in plural rows, a holder 64 which holds the rod lens array 63, and a clamp 65 which fixes these structures 61-64. The LED unit 62 includes an LED array chip (or LED/driving-IC chip) 62a. The LED array chip 62a includes one or more of the semiconductor light-emitting devices of the first or second embodiments arranged in plural rows. Light generated by the LED array chip 62a is emitted outside via the rod lens array 63. The LED head 60 is used as a light exposure device for forming an electrostatic latent image in an electrophotographic printer or an electrophotographic copier. The construction of the LED head including the semiconductor light-emitting device of the first or second embodiments is not limited to that shown in FIG. 8.

FOURTH EMBODIMENT

Figure 9:
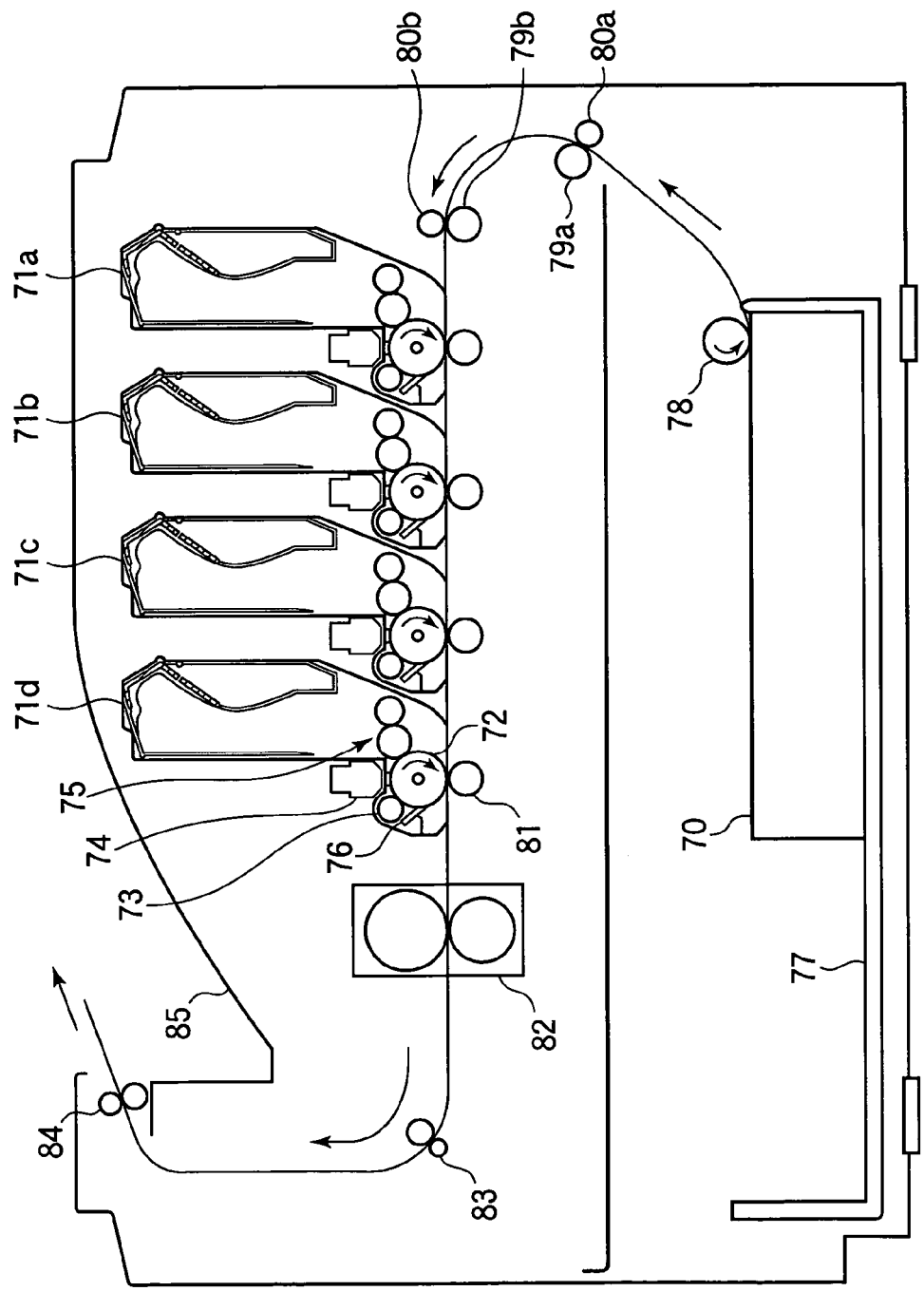
FIG. 9 is a cross-sectional view schematically showing the construction of an image-forming apparatus according to a fourth embodiment of the present invention.

FIG. 9 is a cross-sectional view schematically showing the construction of an image-forming apparatus according to a fourth embodiment of the present invention. As shown in FIG. 9, the image-forming apparatus includes four process units 71a-71d which form images of the four colors yellow, magenta, cyan and black using an electrophotographic technique. The process units 71a-71d are tandem-type and disposed along a transport path of a recording medium 70. The process units 71a-71d include a photosensitive drum 72 as an image carrier, a charging device 73 disposed near the photosensitive drum 72 which charges the surface of the photosensitive drum 72, and an exposure device 74 which selectively irradiates the surface of the charged photosensitive drum 72 so as to form an electrostatic latent image thereupon. The exposure device 74 may be the LED head 60 described in the third embodiment, and the LED head 60 contains the semiconductor light-emitting device described in the first or second embodiments.

The image-forming apparatus further houses a developing device 75 which transports toner to the surface of the photosensitive drum 72 on which the electrostatic latent image is formed, and a cleaning device 76 which removes toner remaining on the surface of the photosensitive drum 72. The each photosensitive drum 72 rotates in the direction of the arrow due to a drive mechanism including a power supply and gears, not shown. The image-forming apparatus further includes a paper cassette 77 for housing the recording medium 70 such as paper or the like, and a hopping roller 78 which separates and transports the recording medium 70 one sheet at a time. Downstream of the hopping roller 78 in the transport direction of the recording medium 70, pinch rollers 80a and 80b, and resist rollers 79a and 79b which grip the recording medium 70 and correct any skew of the recording medium 70 together with the pinch rollers 80a and 80b, and transport it to the process units 71a-71d, are provided. The hopping roller 78 and resist rollers 79a and 79b rotate in synchronism with the power supply, not shown.

The image-forming apparatus further includes transfer rollers 81 disposed opposite the photosensitive drum 72. The transfer rollers 81 are formed of semi electrically-conducting rubber or the like. The potential of the photosensitive drum 72 and the potential of the transfer rollers 81 are set so that the toner image on the photosensitive drum 72 is transferred to the recording medium 70. The image-forming apparatus also includes a fixing device 82 which heats, pressurizes and fixes the toner image on the recording medium 70, and ejection rollers 83 and 84 which eject the recording medium 70 which has passed through the fixing device 82.

The recording medium 70 stacked in the paper cassette 77 is separated and transported one sheet at a time by the hopping roller 78. The recording medium 70 passes through the resist rollers and pinch rollers, and passes through the process units 71a-71d in that order. In the process units 71a-71d, the recording medium 70 passes between the photosensitive drum 72 and transfer roller 81 so that toner of each color is transferred in sequence, and heated and pressurized by the fixing unit 82 so that a toner image of each color is fixed on the recording medium. Subsequently, the recording medium 70 is ejected into a stacker part 85 by the eject roller. The construction of the image-forming apparatus including the semiconductor light-emitting device of the first or second embodiments, or the LED head of the third embodiment, is not limited to that shown in FIG. 9.

What is claimed is:

1. A semiconductor light-emitting device comprising:
  a semiconductor light-emitting thin film having a first surface and a second surface arranged facing in opposite directions;
  a first optically reflecting surface disposed on said first surface of said semiconductor light-emitting thin film; and
  a second optically reflecting surface disposed on said second surface of said semiconductor light-emitting thin film,
  wherein light generated in said semiconductor light-emitting thin film passes through said first surface and is then emitted,
  wherein when $\lambda_0$ is a center wavelength of light generated in said semiconductor light-emitting thin film, n is a refractive index of said semiconductor light-emitting thin film, h is a thickness of said semiconductor light-emitting thin film, m is 0 or a positive integer, and $\xi$ is a half bandwidth of a light emission spectrum when there is no interference between light rays generated in said semiconductor light-emitting thin film, the thickness h satisfies a following first conditional equation:

$$0.9 \times (2m+1)\frac{\lambda_0}{4n} \leq h \leq 1.1 \times (2m+1)\frac{\lambda_0}{4n}$$

and, when m is not 0, m in the first conditional equation satisfies a following second conditional equation:

$$\frac{2m+1}{m(m+1)}\frac{\lambda_0}{2} > \xi.$$

2. The semiconductor light-emitting device according to claim 1, wherein said second optically reflecting surface is a surface of a metal layer disposed on a side of the second surface of said semiconductor light-emitting thin film.

3. The semiconductor light-emitting device according to claim 1, wherein said first optically reflecting surface is a surface of an electrode disposed on a side of the first surface of said semiconductor light-emitting thin film.

4. The semiconductor light-emitting device according to claim 1, wherein said semiconductor light-emitting thin film is an epitaxial film.

5. An LED head comprising the semiconductor light-emitting device according to claim 1.

6. An image-forming apparatus comprising the LED head according to claim 5.

7. A semiconductor light-emitting device comprising:
a semiconductor light-emitting thin film having a first surface and a second surface arranged facing in opposite directions;
a first optically reflecting surface disposed on said first surface of said semiconductor light-emitting thin film; and
a second optically reflecting surface disposed on said second surface of said semiconductor light-emitting thin film,
wherein light generated in said semiconductor light-emitting thin film passes through said first surface and is then emitted,
wherein when $\lambda_0$ is a center wavelength of light generated in said semiconductor light-emitting thin film, n is a refractive index of said semiconductor light-emitting thin film, h is a thickness of said semiconductor light-emitting thin film, m is 0 or a positive integer, and $\xi$ is a half bandwidth of a light emission spectrum when there is no interference between light rays generated in said semiconductor light-emitting thin film, the thickness h substantially satisfies a following first conditional equation:

$$h = (2m+1)\frac{\lambda_0}{4n}$$

and, when m is not 0, m in the first conditional equation satisfies a following second conditional equation:

$$\frac{2m+1}{m(m+1)}\frac{\lambda_0}{2} > \xi.$$

8. The semiconductor light-emitting device according to claim 7, wherein said second optically reflecting surface is a surface of a metal layer disposed on a side of the second surface of said semiconductor light-emitting thin film.

9. The semiconductor light-emitting device according to claim 7, wherein said first optically reflecting surface is a surface of an electrode disposed on a side of the first surface of said semiconductor light-emitting thin film.

10. The semiconductor light-emitting device according to claim 7, wherein said semiconductor light-emitting thin film is an epitaxial film.

11. An LED head comprising the semiconductor light-emitting device according to claim 7.

12. An image-forming apparatus comprising the LED head according to claim 11.

13. A semiconductor light-emitting diode, comprising:
an LED thin film having a first surface and a second surface arranged facing in opposite directions;
a first optically reflecting surface disposed on said first surface of said LED thin film; and
a second optically reflecting surface disposed on said second surface of said LED thin film,
wherein light generated in said LED thin film passes through said first surface and is then emitted,
wherein when $\lambda_0$ is a center wavelength of light generated in said LED thin film, n is a refractive index of said LED thin film, h is a thickness of said LED thin film, m is 0 or a positive integer, and $\xi$ is a half bandwidth of a light emission spectrum when there is no interference between light rays generated in said LED thin film, the thickness h satisfies a following first conditional equation:

$$0.9 \times (2m+1)\frac{\lambda_0}{4n} \leq h \leq 1.1 \times (2m+1)\frac{\lambda_0}{4n}$$

and, when m is not 0, m in the first conditional equation satisfies a following second conditional equation:

$$\frac{2m+1}{m(m+1)}\frac{\lambda_0}{2} > \xi.$$

14. The semiconductor light-emitting diode according to claim 13, wherein said second optically reflecting surface is a surface of a metal layer disposed on the second surface of said LED thin film.

15. The semiconductor light-emitting diode according to claim 13, wherein said first optically reflecting surface is a surface of an electrode disposed on the first surface of said LED thin film.

16. The semiconductor light-emitting device according to claim 13, wherein said LED thin film is an epitaxial film.

17. The semiconductor light-emitting device according to claim 13, wherein the thickness h of said LED thin film is about 2067 nm or less.

* * * * *